US010895609B2

(12) United States Patent
Matus et al.

(10) Patent No.: US 10,895,609 B2
(45) Date of Patent: Jan. 19, 2021

(54) CIRCUIT PROTECTION DEVICE WITH PTC ELEMENT AND SECONDARY FUSE

(71) Applicant: Littelfuse, Inc., Chicago, IL (US)

(72) Inventors: Yuriy Borisovich Matus, Pleasanton, CA (US); Martin Pineda, Fremont, CA (US); Kedar V. Bhatawadekar, Santa Clara, CA (US)

(73) Assignee: Littelfuse, Inc., Chicago, IL (US)

( * ) Notice: Subject to any disclaimer, the term of this patent is extended or adjusted under 35 U.S.C. 154(b) by 76 days.

(21) Appl. No.: 16/407,624

(22) Filed: May 9, 2019

(65) Prior Publication Data

US 2020/0355736 A1   Nov. 12, 2020

(51) Int. Cl.
| | |
|---|---|
| *G01R 31/74* | (2020.01) |
| *H01C 1/144* | (2006.01) |
| *H01C 1/14* | (2006.01) |
| *H02H 9/02* | (2006.01) |
| *G01R 31/50* | (2020.01) |

(52) U.S. Cl.
CPC ............. *G01R 31/74* (2020.01); *G01R 31/50* (2020.01); *H01C 1/144* (2013.01); *H01C 1/1406* (2013.01); *H02H 9/026* (2013.01)

(58) Field of Classification Search
CPC ...... G01R 31/50; G01R 31/74; H01C 1/1406; H01C 1/144; H02H 9/026

USPC ......................................................... 361/106
See application file for complete search history.

(56) References Cited

U.S. PATENT DOCUMENTS

| | | | |
|---|---|---|---|
| 7,505,241 B2 | 3/2009 | McLoughlin et al. | |
| 2009/0027821 A1 | 1/2009 | Colby et al. | |
| 2012/0092123 A1 | 4/2012 | Goldstein | |
| 2015/0303018 A1* | 10/2015 | Banba | H01H 85/045 337/416 |
| 2017/0076900 A1 | 3/2017 | Iwai | |

OTHER PUBLICATIONS

International Search Report dated Aug. 12, 2020 for PCT/US2020/032302 filed May 11, 2020.

* cited by examiner

*Primary Examiner* — Kevin J Comber

(74) *Attorney, Agent, or Firm* — Kacvinsky Daisak Bluni PLLC

(57) ABSTRACT

A circuit protection device including a primary fuse, and a positive temperature coefficient (PTC) device and a secondary fuse electrically connected in series with one another and in parallel with the primary fuse, the secondary fuse formed of a quantity of solder disposed on a dielectric surface, wherein the dielectric surface exhibits a de-wetting characteristic relative to the solder such that, when the solder is melted, the solder draws away from the dielectric surface to create a galvanic opening.

18 Claims, 3 Drawing Sheets

CIRCUIT PROTECTION DEVICE WITH PTC ELEMENT AND SECONDARY FUSE

BACKGROUND

Field

The present disclosure relates generally to the field of circuit protection devices. More specifically, the present disclosure relates to a circuit protection device including a positive temperature coefficient element and a secondary fuse for facilitating arc quenching and galvanic opening.

Description of Related Art

Fuses are commonly used as circuit protection devices and are typically installed between a source of electrical power and a component in an electrical circuit that is to be protected. A conventional fuse includes a fusible element disposed within a hollow, electrically insulating fuse body. Upon the occurrence of a fault condition, such as an overcurrent condition, the fusible element melts or otherwise separates to interrupt the flow of electrical current through the fuse.

When the fusible element of a fuse separates as a result of an overcurrent condition, it is sometimes possible for an electrical arc to propagate through the air between the separated portions of the fusible element (e.g., through vaporized particulate of the melted fusible element). If not extinguished, this electrical arc may allow significant follow-on currents to flow to from a source of electrical power to a protected component in a circuit, resulting in damage to the protected component despite the physical opening of the fusible element.

One solution that has been implemented to eliminate electrical arcing in fuses is to replace the fusible element of a fuse with a positive temperature coefficient (PTC) element. A PTC element is formed of a PTC material composed of electrically conductive particles suspended in a non-conductive medium (e.g., a polymer). PTC materials exhibit a relatively low electrical resistance within a normal operating temperature range. However, when the temperature of a PTC material exceeds the normal operating temperature range and reaches a "trip temperature," such as may result from excessive current flowing through the PTC material, the resistance of the PTC material increases sharply. This increase in resistance mitigates or arrests the flow of current through the PTC element. Subsequently, when the PTC material cools (e.g., when the overcurrent condition subsides), the resistance of the PTC material decreases, and the PTC element becomes conductive again. The PTC element thus acts as a resettable fuse. Since the PTC element does not physically open in the manner of a fusible element, there is no opportunity for an electrical arc to form or propagate.

While PTC elements have proven to be effective for mitigating electrical arcing in circuits, there exist many applications in which it is desirable to effectuate galvanic opening (i.e., permanent, non-resettable opening) in a circuit upon the occurrence of an overcurrent condition. PTC elements do not provide galvanic opening because of their "resettable" nature. Thus, it is desirable to provide a circuit protection device that effectively prevents or mitigates electrical arcing and that also provides galvanic opening in a circuit upon the occurrence of an overcurrent condition.

It is with respect to these and other considerations that the present improvements may be useful.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

A circuit protection device in accordance with a non-limiting embodiment of the present disclosure may include a primary fuse, and a positive temperature coefficient (PTC) device and a secondary fuse electrically connected in series with one another and in parallel with the primary fuse, the secondary fuse formed of a quantity of solder disposed on a dielectric surface, wherein the dielectric surface exhibits a de-wetting characteristic relative to the solder such that, when the solder is melted, the solder draws away from the dielectric surface to create a galvanic opening.

Another circuit protection device in accordance with a non-limiting embodiment of the present disclosure may include a dielectric substrate, a primary fuse disposed on a first side of the dielectric substrate and having first and second terminals electrically connected to respective first and second conductive traces on the dielectric substrate, a positive temperature coefficient (PTC) device and a secondary fuse electrically connected in series with the with one another and in parallel with the primary fuse, the PTC device attached to a second side of the dielectric substrate by a dielectric cap covering an end of the PTC device, the secondary fuse formed of a quantity of solder extending from a first electrode of the PTC device onto the dielectric cap, wherein the dielectric cap exhibits a de-wetting characteristic relative to the solder such that, when the solder is melted, the solder draws away from the dielectric cap to create a galvanic opening, and a first lead wire and a second lead wire for electrically connecting the circuit protection device within a circuit, wherein the first lead wire is electrically connected to the first terminal of the primary fuse and to the secondary fuse and the second lead wire is electrically connected to the second terminal of the primary fuse and to a second electrode of the PTC device, wherein the first and second lead wires are connected to the first and second terminals of the primary fuse, respectively, by first and second electrically conductive vias formed in the dielectric substrate.

DETAILED DESCRIPTION

An exemplary embodiment of a circuit protection device in accordance with the present disclosure will now be described more fully hereinafter with reference to the accompanying drawings. The circuit protection device may, however, be embodied in many different forms and should not be construed as being limited to the embodiments set forth herein. Rather, these embodiments are provided so that this disclosure will convey certain exemplary aspects of the circuit protection device to those skilled in the art.

Figure 1:
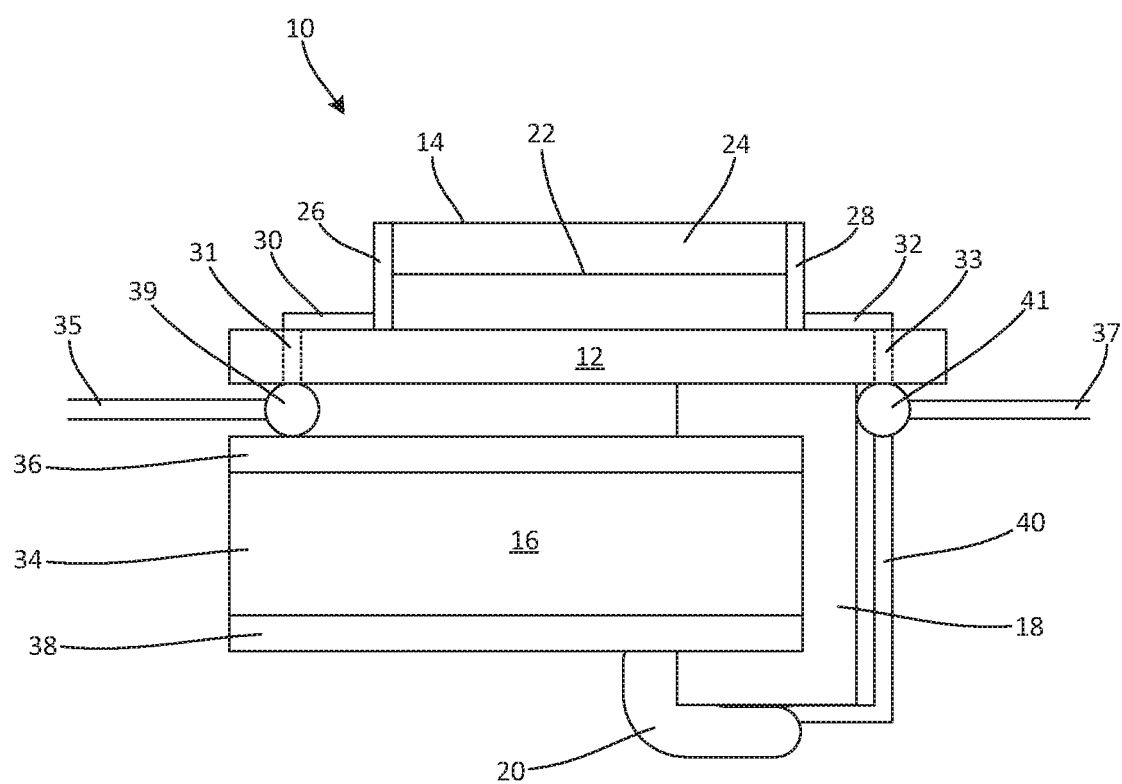
FIG. 1 is a cross-sectional side view illustrating a circuit protection device in accordance with an exemplary embodiment of the present disclosure.

Referring to FIG. 1, a cross sectional side view illustrating a circuit protection device 10 (hereinafter "the device 10") in accordance with an exemplary embodiment of the present disclosure is shown. The device 10 may generally include a dielectric substrate 12, a primary fuse 14, a positive temperature coefficient (PTC) device 16, a dielectric cap 18, and a secondary fuse 20. For the sake of convenience and clarity, terms such as "front," "rear," "top," "bottom," "up," "down," "left," and "right" may be used herein to describe the relative placement and orientation of various components of the device 10, each with respect to the geometry and orientation of the device 10 as it appears in FIG. 1. Said terminology will include the words specifically mentioned, derivatives thereof, and words of similar import.

The dielectric substrate 12 may be a substantially planar member formed of an electrically insulating, thermally resistant material. In a particular embodiment, the dielectric substrate 12 may be formed of a glass-reinforced epoxy laminate material such as FR-4. The present disclosure is not limited in this regard, and it is contemplated that the dielectric substrate 12 may alternatively be formed of various other electrically-insulating materials, including, but not limited to, various ceramics, plastics, composites, etc.

The primary fuse 14 may be disposed on a top surface of the dielectric substrate 12 and may include a fusible element 22 that extends through a dielectric fuse body 24 between first and second electrically conductive terminals 26, 28 at opposing ends of the fuse body 24. In various embodiments, the primary fuse 14 may be a conventional surface mount fuse, cartridge fuse, or the like. The terminals 26, 28 may be electrically connected (e.g., soldered) to electrically conductive traces 30, 32 that extend along the top surface of the dielectric substrate 12. The traces 30, 32 may be electrically connected to respective vias 31, 33 that extend through the dielectric substrate 12. Lead wires 35, 37 may be electrically connected to the lower termini of the vias 31, 33 by respective solder fillets 39, 41 and may be used to electrically connect the device 10 within a circuit (e.g., between a source of electrical power and a load). The primary fuse 14, traces 30, 32, and vias 31, 33 thus provide a current path between the lead wires 35, 37.

The primary fuse 14 may be rated to handle a specific current ("current rating") above which the fusible element 22 will melt and separate. As will be familiar to those of ordinary skill in the art, the current rating of the primary fuse 14 may be influenced by various factors, including, but not limited to, the size, shape, and material of the fusible element 22.

The PTC device 16, which may be coupled to a bottom surface of the dielectric substrate 12 by the dielectric cap 18 (as described below), may be a laminate structure that generally includes a PTC element 34 with electrically conductive top and bottom electrodes 36, 38 disposed on top and bottom surfaces thereof. The top electrode 36 may be electrically connected to the via 31 and to the lead wire 35 by the solder fillet 39. The top and bottom electrodes 36, 38 may be formed of any suitable, electrically conductive material, including, but not limited to, copper, gold, silver, nickel, tin, etc. The PTC element 34 may be formed of any type of PTC material (e.g., polymeric PTC material, ceramic PTC material, etc.) formulated to have an electrical resistance that increases as the temperature of the PTC element 34 increases. Particularly, the PTC element 34 may have a predetermined "trip temperature" above which the electrical resistance of the PTC element 34 rapidly and drastically increases (e.g., in a nonlinear fashion) in order to substantially arrest current passing therethrough. In a non-limiting, exemplary embodiment of the device 10, the PTC element 34 may have a trip temperature in a range of 80 degrees Celsius to 130 degrees Celsius. Additionally, the PTC element 34 may have, within its normal operating temperature range (i.e., below its trip temperature), a resistance that is greater than a resistance of the primary fuse 14.

The dielectric cap 18 may surround or cover a longitudinal end of the PTC device 16 (e.g., the right end of the PTC device 16 as pictured in FIG. 1) such that portions of the dielectric cap 18 are disposed on, and cover, portions of the top and bottom electrodes 36, 38 of the PTC device 16. In various embodiments, the dielectric cap 18 may have a substantially "C-shaped" cross section defined by adjoining top, side, and bottom portions as shown in FIG. 1. The present disclosure is not limited in this regard. A top surface of the dielectric cap 18 may be affixed to the bottom surface of the dielectric substrate 12, such as by adhesive (e.g., epoxy), mechanical fasteners, ultrasonic welds, etc. The dielectric cap 18 may be formed of a low surface energy, electrically insulating, thermally resistant material. Examples of such materials include, but are not limited to, perfluoroalkoxy (PFA), ethylene tetrafluoroethylene (ETFE), or polyvinylidene fluoride (PVDF).

The secondary fuse 20 may be formed of a quantity of solder that is disposed on the bottom electrode 38 of the PTC device 16 and that extends onto the bottom surface of the dielectric cap 18. An electrically conductive trace or lead 40 may extend from the secondary fuse 20 around the dielectric cap 18 and into connection with the solder fillet 41 on the bottom surface of the dielectric substrate 12. Thus, the secondary fuse 20 and the lead 40 may place the bottom electrode 38 of the PTC device 16 in electrical communication with the via 33 and the lead wire 37, wherein the dielectric cap 18 provides an electrically insulating barrier between the PTC device 16 and each of the lead 40, the solder fillet 41, the lead wire 37, and the via 33. The solder from which the secondary fuse 20 is formed may be selected to have a melting temperature that is higher than the trip temperature of the PTC element 34. For example, if excessive current flows through the secondary fuse 20 and the PTC device 16, the PTC element 34 may heat up and reach its trip temperature, arresting current flowing therethrough, before the secondary fuse 20 is sufficiently heated to melt (as described in greater detail below). Additionally, the solder from which the secondary fuse 20 is formed and the material from the which the dielectric cap 18 is formed may be selected such that, when the solder is in a melted or semi-melted state, the solder may have an aversion to, or a tendency to draw away from or to bead on, the surface of the dielectric cap 18. That is, the material of the dielectric cap 18 may exhibit a significant "de-wetting" characteristic relative to the solder from which the secondary fuse 20 is formed. In one example, the dielectric cap 18 may be formed of PFA and the solder may be SAC305 solder. In another example, the dielectric cap 18 may be formed of ETFE and the solder may be eutectic solder. In another example, the dielectric cap 18 may be formed of PVDF and the solder may be a low melt solder (i.e., solder with a melting temperature below 175 degrees C.). The present disclosure is not limited in this regard.

Figure 2:
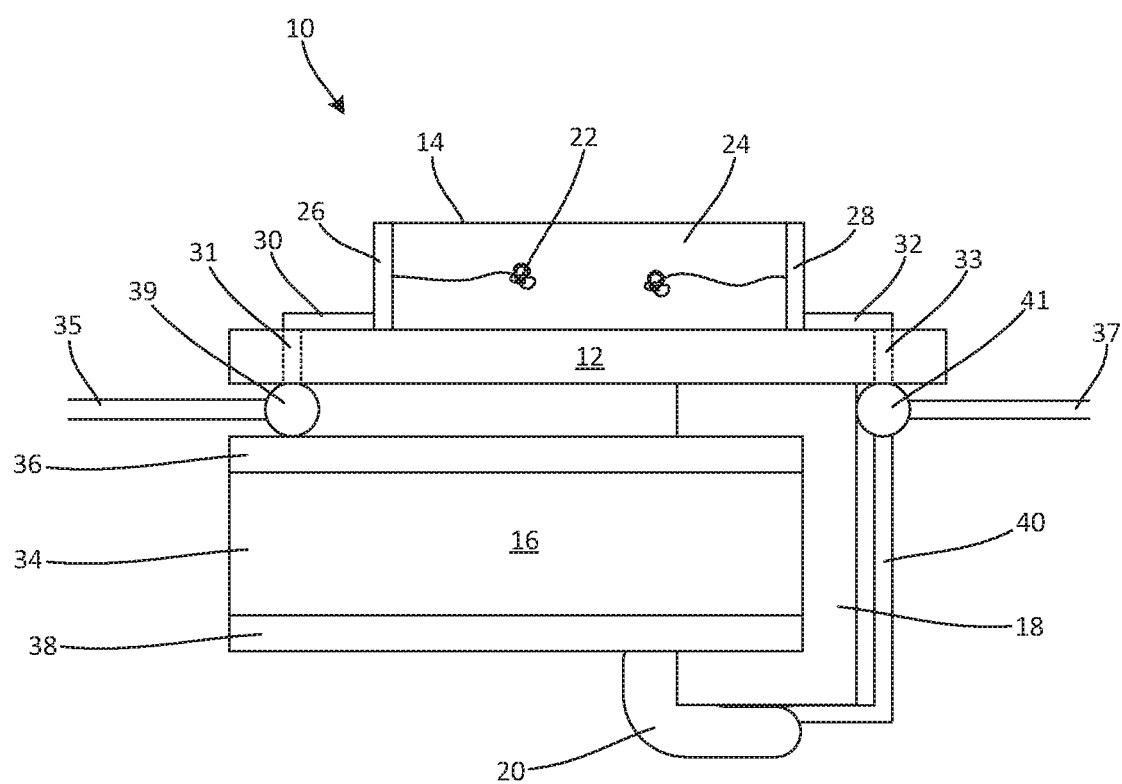
FIG. 2 is a cross-sectional side view illustrating the circuit protection device shown in FIG. 1 with the primary fuse of the circuit protection device in an open state.

During normal operation, the device 10 may be connected in a circuit (e.g., between a source of electrical power and a load) by the lead wires 35, 37, and current may flow between the lead wires 35, 37 through a path that includes the vias 31, 33, the traces, 30, 32 and the primary fuse 14. Upon the occurrence of an overcurrent condition, wherein current flowing through the device 10 exceeds to the current rating of the primary fuse 14, the fusible element 22 of the primary fuse 14 may melt or otherwise separate as shown in FIG. 2. The current is then diverted to flow through the only available alternate path, i.e., through the lead 40, the secondary fuse 20, and the PTC device 16. Since the current is allowed to flow through this alternate path, electrical potential is not able to accumulate between the separated ends of the melted fusible element 22, thereby precluding the formation and propagation of an electrical arc in the primary fuse 14.

Figure 3:
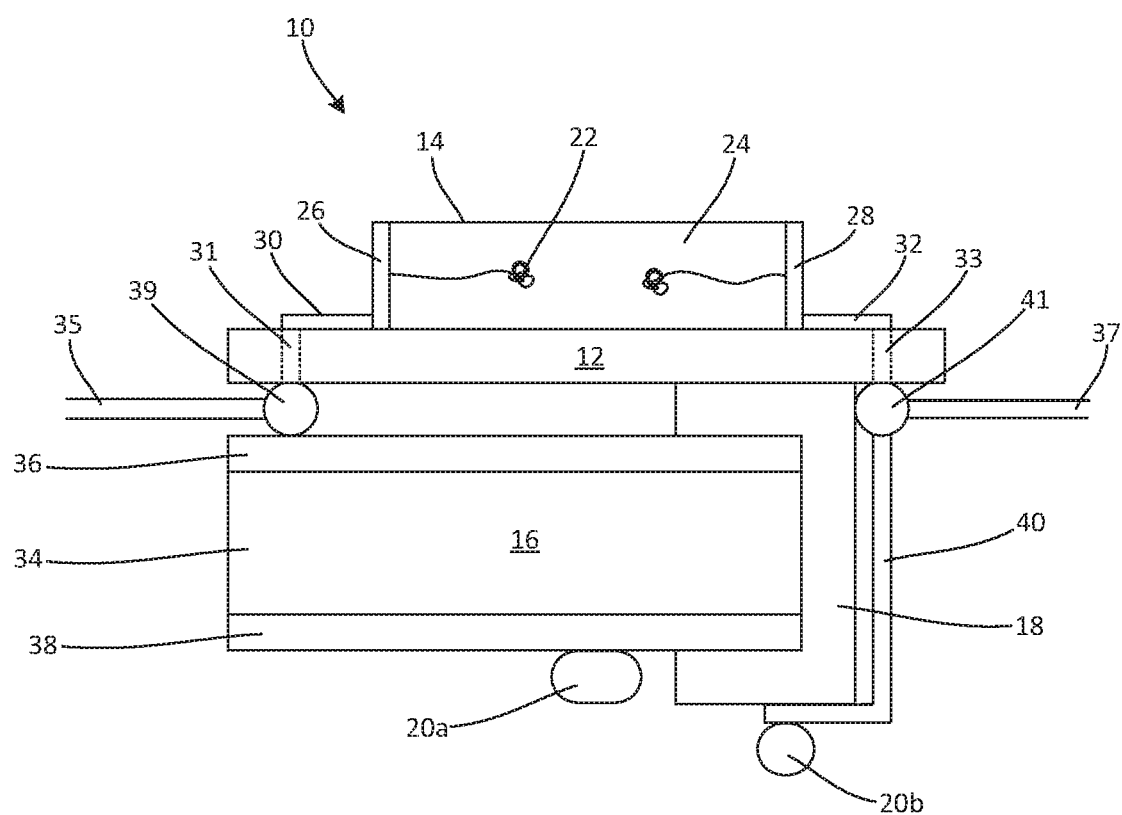
FIG. 3 is a cross-sectional side view illustrating the circuit protection device shown in FIGS. 1 and 2 with both the primary fuse and the secondary fuse of the circuit protection device in an open state.

The persisting overcurrent flowing through the alternate path in the device 10 may cause the PTC element 34 to rapidly heat up and exceed its trip temperature, whereby the resistance of the PTC element 34 may rapidly increase and substantially arrest current flowing therethrough. Simultaneously (or substantially simultaneously), heat radiated by the PTC element 34 may cause the secondary fuse 20 to melt and separate as shown in FIG. 3. Owning to the low surface energy of the dielectric cap 18 and the aversive, "de-wetting" characteristic of the dielectric cap 18 relative to the melted or semi-melted solder of the secondary fuse 20 (described above), the separated portions 20a, 20b of the secondary fuse 20 may draw away from one another and away from the surface of the dielectric cap 18 and may accumulate on the bottom electrode 38 of the PTC device 16 and on the lead 40, respectively, thereby providing a galvanic opening (i.e., a permanent, non-resettable opening) in the device 10. Thus, even after the overcurrent condition subsides and the PTC element 34 cools to below its trip temperature and becomes conductive again, the separated portions 20a, 20b of the secondary fuse 20 provide and maintain galvanic opening in the device 10 such that current cannot flow through the device 10.

In view of the above, it will be appreciated by those of ordinary skill in the art that the device 10 of the present disclosure provides an advantage in that it effectively prevents or mitigates electrical arcing and also provides galvanic opening upon the occurrence of an overcurrent condition. Additionally, the device 10 of the present disclosure provides a very fast response (i.e., very fast opening of the secondary fuse 20) in the event of an overcurrent condition, because the secondary fuse 20 is directly connected to the bottom electrode 38 of the PTC device 16 and is therefore rapidly melted in response to heating of the PTC element 34.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A circuit protection device comprising:
a primary fuse; and
a positive temperature coefficient (PTC) device and a secondary fuse electrically connected in series with one another and in parallel with the primary fuse, the secondary fuse comprising a quantity of solder disposed on a dielectric surface, wherein the dielectric surface exhibits a de-wetting characteristic relative to the solder such that, when the solder is melted, the solder draws away from the dielectric surface to create a galvanic opening;
wherein the primary fuse is disposed on a first side of a dielectric substrate and the PTC device is connected to a second side of the dielectric substrate opposite the first side by a dielectric cap that defines the dielectric surface.

2. The circuit protection device of claim 1, wherein the solder is SAC305 solder and the dielectric surface is formed of perfluoroalkoxy.

3. The circuit protection device of claim 1, wherein the solder is eutectic solder and the dielectric surface is formed of ethylene tetrafluoroethylene.

4. The circuit protection device of claim 1, wherein the solder is low melt solder and the dielectric surface is formed of polyvinylidene fluoride.

5. The circuit protection device of claim 1, further comprising a first lead wire and a second lead wire for electrically connecting the circuit protection device within a circuit; wherein the first lead wire is electrically connected to a first terminal of the primary fuse and to the secondary fuse, the secondary fuse connected to a first electrode of the PTC device, and wherein the second lead wire is electrically connected to a second terminal of the primary fuse and to a second electrode of the PTC device.

6. The circuit protection device of claim 5, wherein the first lead wire is connected to the secondary fuse by an electrically conductive lead, and wherein the secondary fuse extends from the lead, over the dielectric surface, to the first electrode of the PTC device.

7. The circuit protection device of claim 6, wherein the dielectric cap provides an electrically insulating barrier between the PTC device and each of the first lead wire and the lead.

8. The circuit protection device of claim 5, wherein the first and second lead wires are connected to the first and second terminals of the primary fuse, respectively, by first and second electrically conductive vias formed in the dielectric substrate.

9. The circuit protection device of claim 1, wherein the secondary fuse has a melting temperature that is higher than a trip temperature of a PTC element of the PTC device.

10. The circuit protection device of claim 1, wherein the PTC device has, within its normal operating temperature range, a resistance that is greater than a resistance of the primary fuse.

11. A circuit protection device comprising:
a dielectric substrate;
a primary fuse disposed on a first side of the dielectric substrate and having first and second terminals electrically connected to respective first and second conductive traces on the dielectric substrate;
a positive temperature coefficient (PTC) device and a secondary fuse electrically connected in series with the with one another and in parallel with the primary fuse, the PTC device attached to a second side of the dielectric substrate by a dielectric cap covering an end of the PTC device, the secondary fuse comprising a quantity of solder extending from a first electrode of the PTC device onto the dielectric cap, wherein the dielectric cap exhibits a de-wetting characteristic relative to the solder such that, when the solder is melted, the solder draws away from the dielectric cap to create a galvanic opening; and a first lead wire and a second lead wire for electrically connecting the circuit protection device within a circuit, wherein the first lead wire is electrically connected to the first terminal of the primary fuse and to the secondary fuse, and wherein the second lead wire is electrically connected to the second terminal of the primary fuse and to a second electrode of the PTC device;

wherein the first and second lead wires are connected to the first and second terminals of the primary fuse, respectively, by first and second electrically conductive vias formed in the dielectric substrate.

12. The circuit protection device of claim 11, wherein the second lead wire is connected to the secondary fuse by an electrically conductive lead.

13. The circuit protection device of claim 12, wherein the dielectric cap provides an electrically insulating barrier between the PTC device and each of the second lead wire and the lead.

14. The circuit protection device of claim 11, wherein the solder is SAC305 solder and the dielectric cap is formed of perfluoroalkoxy.

15. The circuit protection device of claim 11, wherein the solder is eutectic solder and the dielectric cap is formed of ethylene tetrafluoroethylene.

16. The circuit protection device of claim 11, wherein the solder is low melt solder and the dielectric cap is formed of polyvinylidene fluoride.

17. The circuit protection device of claim 11, wherein the secondary fuse has a melting temperature that is higher than a trip temperature of a PTC element of the PTC device.

18. The circuit protection device of claim 11, wherein the PTC device has, within its normal operating temperature range, a resistance that is greater than a resistance of the primary fuse.

\* \* \* \* \*